United States Patent [19]

Shiloh et al.

[11] Patent Number: 4,946,511
[45] Date of Patent: Aug. 7, 1990

[54] THERMOELECTRIC DEVICES

[75] Inventors: Moshe Shiloh; Danielle Ilzycer, both of Ness Ziona, Israel

[73] Assignee: The State of Israel, Atomic Energy Commission, Soreq Nuclear Research Center, Israel

[21] Appl. No.: 308,415

[22] Filed: Feb. 9, 1989

[30] Foreign Application Priority Data

Feb. 10, 1988 [IL] Israel ........................................ 85389

[51] Int. Cl.⁵ ............................................ H01L 35/28
[52] U.S. Cl. ...................................... 136/212; 136/211
[58] Field of Search .................................. 136/211, 212

[56] References Cited

U.S. PATENT DOCUMENTS

| | | | |
|---|---|---|---|
| 4,004,210 | 1/1977 | Yater | 136/200 X |
| 4,149,025 | 4/1979 | Niculescu | 136/211 X |
| 4,415,526 | 11/1983 | Garrett | 136/253 X |
| 4,497,973 | 2/1985 | Heath et al. | 136/212 |
| 4,938,291 | 3/1984 | Eichelberger et al. | 136/236 R X |

Primary Examiner—Peter A. Nelson
Attorney, Agent, or Firm—Steinberg & Raskin

[57] ABSTRACT

A thermoelectric device of the kind that comprises an array of thermoelectric rods of two different materials alternatingly arranged between two carrier plates with each carier plate being a plurality of discrete conductive metal junctions to which the thermoelectric rods are pairwise connected. The two carrier plates are made of synthetic polymeric materials and each of the junctions comprises a monolithic metal member directly linked to a carrier plate.

4 Claims, 2 Drawing Sheets

THERMOELECTRIC DEVICES

FIELD OF INVENTION

The present invention concerns a thermoelectric device of the type comprising an array of thermoelectric rods of two different materials alternatingly arranged between first and second carrier plates each bearing a plurality of discrete conductive metal junctions to which the rods are pairwise connected with the pattern of the junctions on said first and second carrier plates being complementary so that with the exception of two extreme thermoelectric rods each thermoelectric rod of one material forms with two flanking rods of different material two thermoelectric couples, one of which couples is junctioned at the first carrier plate and the other is junctioned at the second carrier plate, whereby there is formed a plurality of thermoelectric couples connected in series.

DESCRIPTION OF THE PRIOR ART

In prior art thermoelectric devices of the kind specified the carrier plates are made of ceramic material and this has several drawbacks. For one because of the fragility of ceramic materials the carrier Plates have to be relatively thick and even so their ability to withstand mechanical shocks is limited. Moreover, due to the very fact that the ceramic carrier plates have to be relatively thick they form a relatively large thermal mass with the consequence that the thermal response of the devices is slow.

Yet another drawback of the prior art thermoelectric devices stems from the fact that ceramic material can only be metal printed, e.g. copper printed with thin layers so that the basic discrete metal platelets produced on a ceramic carrier plate by conventional printing techniques are too thin for constituting adequate junctions of thermoelectric couples having negligible electric resistance. Consequently, in the production of conventional thermoelectric devices it is first required to produce a pattern of metal junction base platelets, e.g. of copper, by conventional printing techniques such as thick film technology, and this is followed by soldering to the base platelets so produced suitably shaped conductive metal tabs, e.g. of copper, to form non-monolithic junctions each comprising a metal substrate and a metal member soldered thereto. The soldering of the metal tabs to the substrate is a tedious manual operation requiring suitably shaped matrices, special fine jigs and highly skilled labour.

It is the object of the present invention to provide an improved thermoelectric device free of all these disadvantages.

SUMMARY OF THE INVENTION

In accordance with the present invention there is provided a thermoelectric device comprising an array of thermoelectric rods of two different materials alternatingly arranged between first and second carrier plates each bearing a plurality of discrete conductive metal junctions to which the thermoelectric rods are pairwise connected with the pattern of the junctions on said first and second carrier plates being complementary so that with the exception of two extreme thermoelectric rods, each thermoelectric rod of one material forms with two flanking rods of different material two thermoelectric couples, one of which couples is junctioned at the first carrier plate and the other is junctioned at the second carrier plate, whereby there is formed a plurality of thermoelectric couples connected in series, characterized in that:

(i) said first and second carrier plates are made of synthetic polymeric materials; and (ii) each of said junctions comprises a monolithic metal member directly linked to a carrier plate.

The term "synthetic polymeric material" used herein is to be understood in a broad sense and also includes within its scope composite laminates and reinforced laminates.

The thermoelectric rods which have to be made of two different materials, can, for example, be made of p and n type bismuth-antimony-telluride-selenide solid solutions containing appropriate dopants such as, for example, iodine and tellurium.

Similar to conventional thermoelectric devices, the thermoelectric devices according to the invention are based on the Peltier effect and can be used as thermoelectric heat pumps, thermoelectric coolers and thermoelectric generators. In the latter application a temperature gradient is established between said first and second carrier plates which results in the generation of a direct current while in the former cases a d.c. is passed through the device and depending on the direction of flow of the electric charge, the device will either heat or cool.

The thermoelectric device according to the invention can be used to advantage in all applications in which conventional thermoelectric devices are used, e.g. as d.c. generators or for heating or cooling in various areas of electricity, electronics and electrooptics, for the refrigeration of food and drinks, and the like.

The invention makes use of recently developed technologies for metal cladding of synthetic polymeric material by which laminates can be produced, the metal layer of which is of sufficient thickness for the purposes of the present invention. Examples of polymeric materials that can be used for the purposes of the present invention are KAPTON (trade name) which is a polyimide produced by E. I. Du Pont De Nemours, U.S.A., an epoxy/glass laminate produced by Sefolam Ltd., Israel, various synthetic polymeric materials supplied by Dielektra, Federal Republic of Germany, and there are many others.

Some of these materials are also supplied by the manufacturers in the form of metal-clad, e.g. copper-clad laminates. In addition, metal-clad polymeric synthetic materials are commercially available, e.g. a KAPTON/Cu laminate produced by Oak Materials Group Inc., U.S.A.

By way of example, synthetic polymeric material/metal laminates suitable for the purposes of the present invention may be prepared by bonding together two or more sheets or mats of reinforcing material such as of textile fabric, paper, cellulose fiber, glass fiber, synthetic fiber and the like, with a synthetic polymeric material. The desired metal pattern is then formed by conventional photolithography by which in preselected areas of the metal-clad laminate the metal is dissolved, leaving behind only the designed printed metal pattern, which for the purposes of the present invention comprises discrete metal platelets.

For the preparation of said first and second carrier plates for thermoelectric devices according to the invention, a patterned metal-clad synthetic polymeric material is cut to size, each of the discrete metal platelets on each carrier plate serving as junctions of individual thermoelectric couples in a device according to the invention. These junctions, which are entirely monolithic, are of a suitable thickness as distinct from the prior art where metal base platelets applied to a ceramic carrier plate by thick film printing, have to be reinforced by soldering thereto suitable metal tabs.

The remaining manufacturing procedure of a thermoelectric device according to the invention is conventional. Where the junctions are of copper they are preferably coated with nickel to prevent the diffusion of copper into the thermoelectric rods and this is followed by the application of a solder whereupon the thermoelectric rods are soldered to the junctions. In this way an intermediate body is produced comprising a carrier plate with a plurality of thermoelectric rods projecting therefrom, arranged in an alternating sequence. In a last step, this intermediate body is brought to bear on a second carrier plate similar to the first one and bearing a plurality of suitably patterned solder coated discrete junctions and the free ends of the thermoelectric rods are soldered to the junctions on the second carrier plate whereupon the thermoelectric device is complete.

Similar as in the prior art, one of the two carrier plates comprises two terminal junctions to which electric leads are soldered.

The thermoelectric devices according to the invention are superior to the prior art devices in their capability to withstand mechanical shocks and in their reduced thermal mass whereby the speed of the thermal response is significantly increased. Also the manufacture of thermoelectric devices according to the invention is much simpler than that of prior art devices, mainly due to the fact that the two-stage production of the junctions in accordance with the prior art comprising soldering metal tabs to thick film metal substrates on a carrier plate, is no longer required.

DESCRIPTION OF THE DRAWINGS

For better understanding the invention will now be described with reference to the annexed drawings in which.

DESCRIPTION OF A PREFERRED EMBODIMENT

Figure 1:
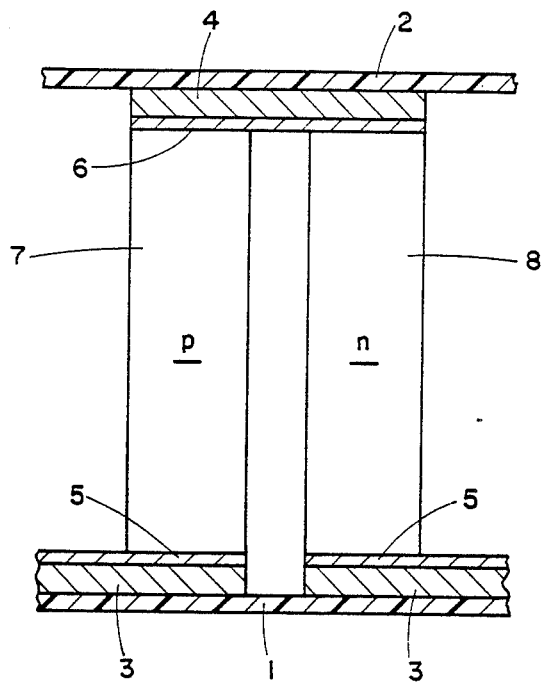
FIG. 1 is a fragmentary of a cross-section of a thermoelectric device according to the invention, showing one couple thereof.

The thermoelectric element fractionally illustrated in FIG. 1 comprises a first carrier plate 1 and a second carrier plate 2. The first carrier plate 1 bears a plurality of copper junctions 3 and the second carrier plate 2 bears a plurality of copper junctions 4, junctions 3 and 4 being staggered in the manner shown. Each of junctions 3 comprises a nickel coat 5 and likewise each of junctions 4 comprises a nickel coat 6 which nickel coats serve to prevent the diffusion of copper into the thermoelectric rods.

Thermoelectric rods of two kinds extend between the carrier plates such as rods 7 and 8 which may, for example, be made of p and n type bismuth-antimony-telluride-selenide solid solutions containing iodine and tellerium dopants. Rods 7 are assumed to be of the p-type material and rods 8 of the n-type material. Rods 7 and 8 are arranged in an alternating sequence such that with the exception of two terminal rods, each rod 7 is flanked by two rods 8 and likewise each rod 8 is flanked by two rods 7. As shown in FIG. 1, a pair of rods 7 and 8 together with a junction 4 of the second carrier plate 2 form together one thermoelectric couple. In a similar manner rod 7 and another rod 8 to the left of it (not shown) together with one junction 3 of the first carrier plate 1 form another thermoelectric couple and likewise rod 8 and another rod 7 to the right of it (not shown) together with the other junction 3 of carrier plate 1 form yet another thermoelectric couple. In this way, a plurality of thermoelectric couples is formed which are connected in series.

Figure 2:
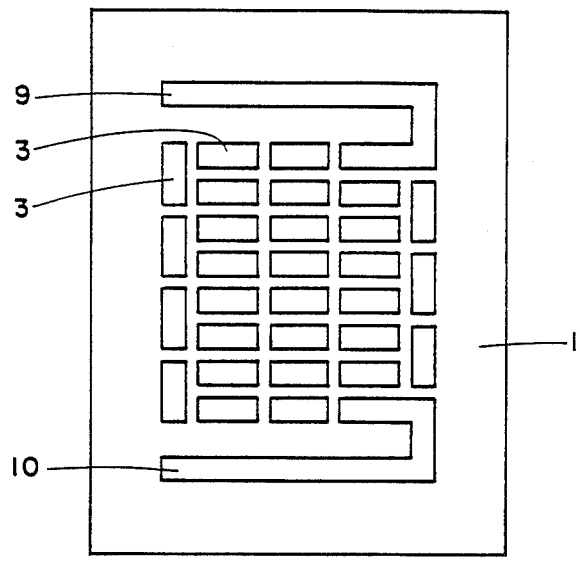
FIG. 2 is a plan view of the first carrier plate of the thermoelectric device according to FIG. 1.

The pattern of junctions 3 on the first carrier plate 1 is shown in FIG. 2 and it is seen that near the ends of the horizontal rows of junctions 3 there are vertical columns of junctions 3 which are required in order to ensure the serial connection between the rows.

It is also seen in FIG. 2 that carrier plate 1 comprises terminal strips 9 and 10 which serve for the connection of electrical leads.

Figure 3:
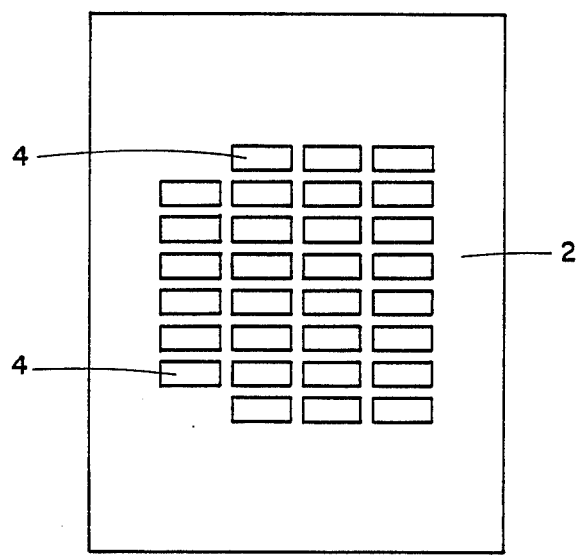
FIG. 3 is a plan view of a second carrier plate of the thermoelectric device according to FIG. 1.

The pattern of junctions 4 of carrier plate 2 is seen from FIG. 3.

The patterns of junctions 3 on the first carrier plate 1 and junctions 4 on the second carrier plate 2 are such that in the assembled thermoelectric device the junctions 3 and 4 are staggered in the manner shown in FIG. 1.

We claim:

1. A thermoelectric device comprising an array of thermoelectric rods of two different materials alternatingly arranged between first and second carrier plates each bearing a plurality of discrete conductive metal junctions to which the thermoelectric rods are pairwise connected by soldering with the pattern of the junctions on said first and second carrier plates being complementary so that with the exception of two extreme thermoelectric rods, each thermoelectric rod of one material forms with two flanking rods of different material two thermoelectric couples said thermoelectric couples having empty spaces between adjacent rods, one of which junctioned at the second carrier plate, whereby there is formed a plurality of thermoelectric couples connected in series, wherein:
   (i) said first and second carrier plates are made of synthetic polymeric material; and
   (ii) each of said junctions comprises a prefabricated monolithic metal member directly linked to a carrier plate.

2. A thermoelectric device according to claim 1 characterized in that said junctions are copper and comprise a nickel coat.

3. A method for making a thermoelectric device, said method comprising the steps of:
   forming first and second carrier plates of synthetic polymer material each bearing a plurality of discrete monolithic conductive material junctions; and
   soldering a plurality of thermoelectric rods to said carrier plates such that opposite ends of each thermoelectric rod are respectively connected to said first and second carrier plates, said thermoelectric rods being spaced apart and each thermoelectric rod of one material forming with two flanking rods of different material two thermoelectric couples, one of which couples is junctioned at the first carrier plate and the other is junctioned at the second carrier plate.

4. The method of claim 3 further comprising coating edges of said metal plates when made of copper with nickel.

* * * * *